(12) United States Patent
Liu et al.

(10) Patent No.: US 8,266,485 B2
(45) Date of Patent: Sep. 11, 2012

(54) TEST MODE SOFT RESET CIRCUITRY AND METHODS

(75) Inventors: Baojing Liu, San Jose, CA (US); Matt Davidson, Mountain View, CA (US); Vladimir Kovalev, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/159,311

(22) Filed: Jun. 13, 2011

(65) Prior Publication Data

US 2011/0246844 A1   Oct. 6, 2011

Related U.S. Application Data

(63) Continuation of application No. 12/019,534, filed on Jan. 24, 2008, now Pat. No. 7,962,819.

(51) Int. Cl.
*G01R 31/28* (2006.01)
*G06F 11/00* (2006.01)

(52) U.S. Cl. .................. 714/731; 714/23
(58) Field of Classification Search .................. None
See application file for complete search history.

(56) References Cited

U.S. PATENT DOCUMENTS 7,783,925 B2 * 8/2010 Swoboda .................. 714/30

* cited by examiner

*Primary Examiner* — Ajay Bhatia
*Assistant Examiner* — Daniel McMahon
(74) *Attorney, Agent, or Firm* — Martine Penilla Group, LLP (57) ABSTRACT

A soft-function trigger state machine includes state machine logic defined to use a scan-in waveform to sample a scan-clock waveform to obtain a sampled data pattern. The state machine logic is defined to compare the sampled data pattern to a soft action pattern to determine whether the sampled data pattern matches the soft action pattern. The state machine logic is also defined to trigger an action associated with the soft action pattern when the sampled data pattern matches the soft action pattern.

20 Claims, 5 Drawing Sheets

TEST MODE SOFT RESET CIRCUITRY AND METHODS

CLAIM OF PRIORITY

This application is a continuation application under 35 U.S.C. 120 of prior U.S. application Ser. No. 12/019,534, filed Jan. 24, 2008, now U.S. Pat. No. 7,962,819 and entitled "Test Mode Soft Reset Circuitry and Methods," which is incorporated herein by reference in its entirety.

BACKGROUND

1. Field of the Invention

The present invention relates testing algorithms and methods for optimizing functionality, while reducing a chip's physical pad and/or pin count.

2. Description of the Related Art

Testing circuitry is a critical function that must be performed to confirm whether a circuit design functions as intended. A common type of testing is performed using logic and methods defined by some or all of the IEEE 1149.1 Test Access Port and Boundary-Scan Architecture, which is herein incorporated by reference. One type of scan testing is referred to as "boundary scan" testing, that allows complete controllability and observability of the boundary pins of a Joint Test Access Group (JTAG) compatible device via software control. Another type uses scan chains to test the combinational logic of a design. Scan chain testing is a common technique used in Design for Test (DFT). DFT techniques add certain testability features to a hardware product design. In scan testing, the added features are special flip flops, called "scan flops". A signal called scan enable is used to assert the scan-flops in the design, to define a long shift register, where input pins called scan-in provide the data to the chain, and output pins called scan-out connect to the output of the chains. When the chip is placed in scan mode, a test pattern can be entered into the chain of scan-flops, provided to the chip's combinational logic being tested, captured, and then read out from the scan-out pins. The output can then be compared to expected results to determine faults in the design. Once scan mode has commenced, the testing will continue until complete, unless a reset is triggered. The chip can exit scan mode upon completing testing, as long as the test mode register can be modified to different values other than scan mode. Nevertheless, a reset may be mandatory when the chip is in a chaotic state.

As noted, certain pins are required to be added to a chip design, which provide access to the testing logic embedded in the chip. Among the known pins required to enable testing, communicate test patters, and output testing pattern results, it is also common to include a test reset pin. Another DFT reset may be required to reset the scan flip flops for certain ATPG algorithms; which will not reset test mode registers and is different from a test mode reset. Normally another dedicated pin is used for that purpose. During a testing process, however, the test engineer or test software may determine that it is time to stop the testing. To do so, the test reset pin is used to communicate reset to test mode registers of the test controller. If the test reset pin is eliminated, without maintaining a reset functionality, the chip must be powered down. A power-down and power-up cycle is time consuming, and would take up precious tester time, which becomes even worse when delay-related tests become mandatory for controllers using nanometer and smaller node technologies.

Further, as more logic and functionality continues to be added to specialty chips and processors, so does the need for more chip pads and package pins. Consequently, although the size of chips and the density of logic manufactured into chips continues to increase, the physical need to interface with the chip continues to force designers to increase a chip's pad area and package size simply to add pins. Although some pads/pins are required to enable chip functionality, others, such as test related pads/pins, serve limited usefulness.

It is in this context that embodiments of the present invention arise.

SUMMARY

Embodiments of the present invention provide methods for allowing added test functionality, while eliminating dedicated test pins of a package or chip. In one embodiment, the test reset pin is eliminated, while the reset functionality is maintained though a soft reset waveform that is provided through existing pins for scan mode testing, such as scan-in pin and scan clock pins. Thus, a dedicated test pin that is simply used to reset a controller is eliminated, thus reducing the die size, package size, which also reduces cost. Although the waveforms that are provided through the scan-in and scan clock pins are used to trigger a soft reset of scan mode testing, the waveforms can be defined to trigger other actions. For instance, the waveform provided to these existing pins can be made to provide different functionality (e.g., soft actions), thus defining a communication channel between a tester and a controller during testing. As will be described in more detail below, the waveform bits are sampled, and if identified to follow a defined bit match, a state machine will trigger an action. The example bit match, when detected by the sampling, will trigger a soft rest of the test mode registers during a scan mode process.

It should be appreciated that the present invention can be implemented in numerous ways, such as a process, an apparatus, a system, a device or a method on a computer readable medium. Several inventive embodiments of the present invention are described below.

In one embodiment, a method for triggering a soft reset of a test mode being executed on an integrated circuit chip is provided. The method includes coupling input-output pins of an integrated circuit chip to tester connections, where the input-output pins include a scan-in pin and a scan clock pin. A test program is defined for testing the integrated circuit chip in the test mode, and the test program including program patterns consistent with the test mode that are defined to occur during a period of testing and a soft-reset pattern that is defined to occur after the period of testing. Then, executing the test program and during execution of the test program, sampling a scan clock waveform provided through the scan clock pin as dictated by transitions of a scan-in waveform provided through the scan-in pin. Upon executing the soft-reset pattern of the test program, detecting a bit match from the sampled scan clock waveform. The bit match triggering the soft reset of the test mode that is executed on the integrated circuit chip.

In another embodiment, an integrated circuit chip having testing logic for testing circuitry of the integrated circuit chip is provided. The integrated circuit chip includes a scan-in pin, a scan clock pin, and a test controller. The test controller has test mode registers for storing a type of test mode to be executed, and the test controller accepting signals from the scan-in pin and the scan clock pin. The scan-in pin and the scan clock pin receiving a test program for the type of test mode and a soft-reset pattern. Also included is a state machine logic that is part of the integrated circuit chip. The state machine logic, during execution of the test program, being configured to direct sampling of a scan clock waveform provided through the scan clock pin as dictated by transitions of a scan-in waveform provided through the scan-in pin. The sampling by the state machine circuitry identifying a bit match from the sampled scan clock waveform upon executing the soft-reset pattern. The identified bit match triggering a soft reset by updating the test mode registers of the test controller.

In another embodiment, a soft-function trigger state machine is disclosed. The state machine includes state machine logic defined to use a scan-in waveform to sample a scan-clock waveform to obtain a sampled data pattern. The state machine logic is defined to compare the sampled data pattern to a soft action pattern to determine whether the sampled data pattern matches the soft action pattern. The state machine logic is defined to trigger an action associated with the soft action pattern when the sampled data pattern matches the soft action pattern.

In another embodiment, a method is disclosed for operating a reset state machine. The method includes simultaneously receiving a scan-in waveform and a scan-clock waveform. The method also includes sampling the scan-clock waveform in accordance with a rising edge of the scan-in waveform. The method also includes detecting a bit match when a certain bit pattern is observed from the sampled scan-clock waveform. The method further includes asserting a test mode soft reset signal in response to detecting the bit match.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DETAILED DESCRIPTION

Broadly speaking, the embodiments of the present invention provide methods for using existing pins of a chip for more than one purpose, to thus eliminate the need for additional chip pads and package pins. Although the examples focus on eliminating a pin used for triggering a reset during scan mode testing, it should be understood that the methodology can be extended to triggering other functionality, without the need for dedicated pins. Additionally, the examples define using the scan-in pin and scan clock pin to communicate waveforms that will be detected by dedicated state machine logic. In alternative embodiments, it is possible to use other pins to communicate other waveforms that can be monitored to detect a time to trigger, activate or control some function. However, if other pins are used, it is desired that the waveforms communicated through the pins do not provide signals that would inappropriately trigger functions normally controlled through those pins. Similarly, the waveforms communicated through the scan-in and scan clock pins are specifically defined to not interfere or trigger functionality that is normally communicated through such pins.

It will be obvious, however, to one skilled in the art, that the present invention may be practiced without some or all of these specific details. In other instances, well known process operations have not been described in detail in order not to unnecessarily obscure the present invention.

Figure 1A:
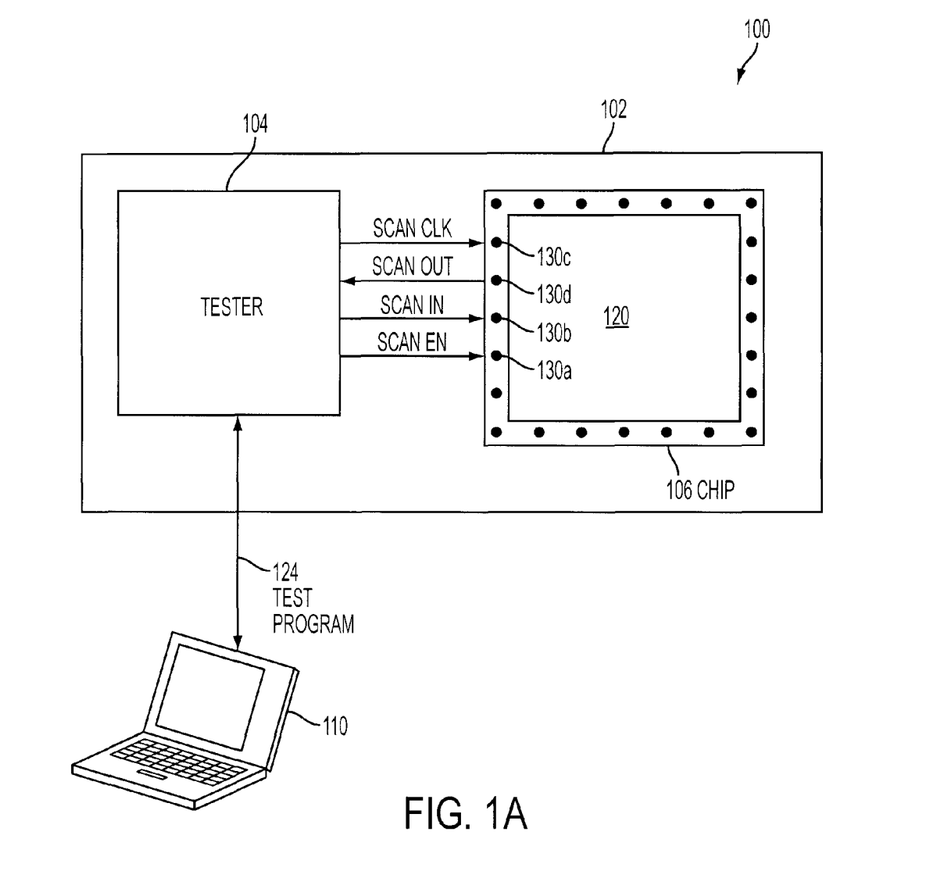
FIGS. 1A-1C illustrate example pattern interfaces between a tester and a chip, and the use of the scan-in and scan clock pins to pass waveforms that can be detected to trigger soft resets of a testing operation.

FIG. 1A illustrates a test set-up 100 including a tester 104, a chip 106, and a computer 110, in accordance with one embodiment of the present invention. The test set-up 100 is shown interfacing the tester 104 with the chip 106 through a variety of pins. Although this invention is not tied to any particular tester, one example tester may be the J750 tester, which is available from Teradyne, Inc. of North Reading, Mass. As shown, chip 106 will have many pins dedicated to a variety of functions, depending on its ultimate implementation. For simplicity, only selected pins are shown interfacing with the tester 104, although it is understood that other pins also interface with the tester 104 and later with a printed circuit board or other module. Therefore, in this example, the tester 104 is shown interfacing with chip 106 through pins 130a for scan enable, 130b for scan-in, 130c for scan-clock and 130d for scan out. As the pin names vary depending on the implementation, specifics regarding other test mode pin names will not be depicted, but it is understood that other pins/names defined by IEEE Standard 1149.1, which is incorporated herein by reference, can also be used.

When the tester 104 places the chip 106 into scan mode, the scan-flops (not shown) integrated into the chip 106 create scan chains that receive test patterns that are part of a test program 214. As noted above, the test patterns are input through the scan in pins[i] and propagated/shifted through the device under test logic 120 of the chip 106. The scan testing continues to allow the pattern to be propagated through the combinational logic of the device under test logic 120 and then output through the scan out pin[i] and then analyzed by the tester 104.

In this embodiment, the chip 106 does not include a test reset pin as existing scan-in pins 130b and scan-clock pin 130c are reused to propagate a waveform that has been configured to trigger a soft reset of the scan mode, when the chip has entered the scan mode as controlled by tester 104.

Figure 1B:
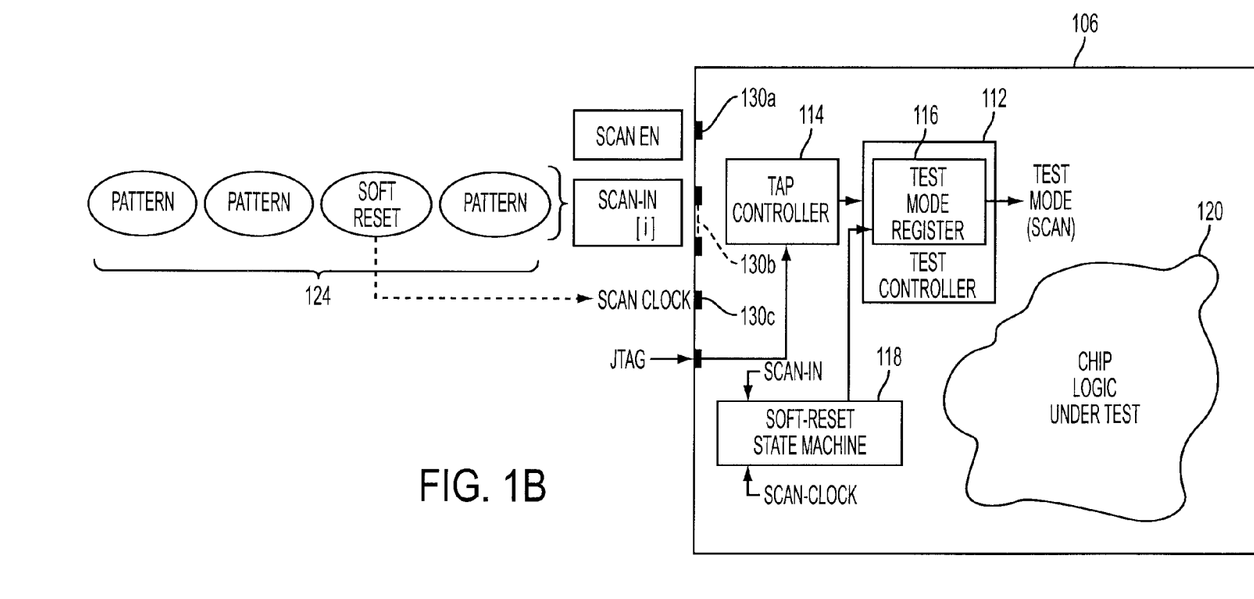
Figure 1C:
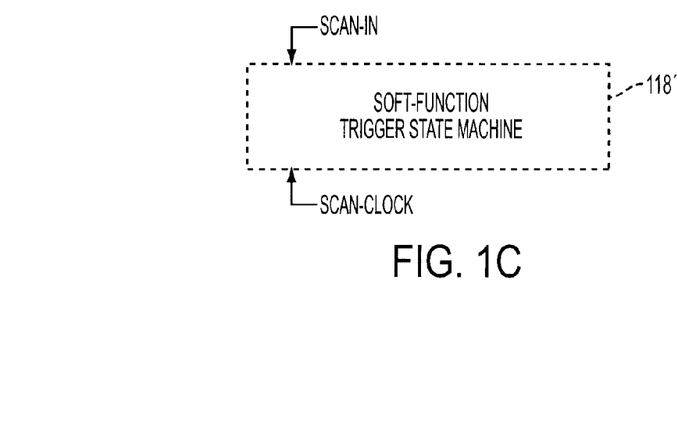

FIG. 1b illustrates a more detailed diagram of a chip 106 having a test access port (TAP) controller 114, a test controller 112, and a soft reset state machine 118. FIG. 1c illustrates soft-function trigger state machine 118', which can be programmed with logic that detect a match, and then triggers an action. Thus, the action does not need to be a reset, but can be some other action that is communicated through reused pins and detected by state machine logic 118'. Returning to FIG. 1b, the TAP controller 114 responds to control sequences supplied through a test access port (TAP) and then generates clock and control signals required for correct operation of the other circuit blocks. The chip 106 is shown having chip logic under test 120. The chip logic under test 120, as is known to those skilled in the art, is the primary logic that defines the functionality of the chip, whether it be an application specific integrated circuit (ASIC), a digital signal processor (DSP), or other logic.

As a general overview, the JTAG TAP 114 contains four pins that drive the circuit blocks and control the operations specified. The TAP therefore facilitates the serial loading and unloading of the instructions and data. The four pins of the TAP are: TMS, TCK, TDI, and TDO. As pins are shared, TMS is commonly used for mode input, TCK is used for scan clock, TDI is used for scan in, and TDO is used for scan out. The TAP controller 114 is a state machine that controls the scanning of the data into the various registers of the JTAG architecture.

Thus, based on the JTAG input, the TAP controller 114 will set the states of test mode registers 116 in the test controller 112. Based on the state of the test mode registers 116, the given mode will be triggered. In this example, the test mode registers are decoded by the test controller 112 to define that the test mode is "scan mode." Once the scan mode has been commenced, the entire scan mode test program must march to completion, unless a reset is triggered. Specifically, the path to the registers is blocked (e.g., write enable is disabled) once the scan mode is started. However, as noted above, the test reset pin was eliminated. The reset, if desired, will thus be triggered without the use of signals coming from a test reset pin.

As shown, the chip 106 is configured to receive a test program 124 through the various pins dedicated for scan mode testing. A test program 124 will typically include a plurality of test patterns that are propagated by the tester 104 to the chip 106. In one embodiment of the invention, the test program 124 is defined to also include one or more soft reset patterns, in addition to the other patterns used for testing the chip 106. The soft reset pattern that is shown as part of test program 124 will be provided to the scan-in pin as wells as the scan-clock pin (as shown by the dashed line arrow).

The soft reset pattern is defined as a waveform that will behave differently than standard scan and clock waveforms, so as to avoid false triggering of basic scan patterns, such as basic scan, fast sequential scan, full sequential scan and like. Broadly speaking, the scan-in pin and the scan-clock pin are used to provide a special waveforms, such as the soft reset waveform. Reuse of the scan-in pins and scan clock is possible based on the following observations. The scan-in toggles at the beginning of the test cycle (scan shift/parallel). And, the typical scan-clocks have waveforms that include rise times of about 50% of the clock and fall times of about 80% of the clock period. For normal scan patterns, if the scan-clock is sampled at either the rising or falling edges of the scan data, a constant data pattern is observed.

However, if the scan-in and scan-clock is changed to a different waveform, then different data patterns can be observed by just sampling scan-clock using either edge of the scan data. Thus, signature patterns, such as the soft reset pattern, can be shifted into the scan-in and scan-clock paths during scan capture cycle. As noted, these patterns will be distinct form the scan patterns generated by an Automatic Test Pattern Generator (ATPG) tool to avoid false triggering. The signature patterns, such as the soft reset pattern, are sampled and compared by the soft reset state machine 118 to determine if a specific pattern is matched. If the soft reset pattern matches the bits that is detected by the soft reset state machine 118, a soft reset can be asserted to exit the scan mode.

As already noted, this functionality can be extended to define different signature patterns that can be decoded to control different control sequences or signals, thus defining communication channel between the tester 104 and the controller 112 during scan mode, using the existing scan-in and scan-clock pins. Thus, other functionality that can be triggered, other than a soft reset, is only limited by the type of implemented circuit. Thus, without limitation, some other example functionality can include stopping the clock, changing the oscillation trim value to change frequencies, and changing a regulator trim value. In one embodiment, changing the test frequency can enable testing of delays, testing at-speed, and other functions. These other functions, as defined herein, can be referred to as "soft actions", as these functional actions at directed in response to the detection of a match, and thus, do not require additional pins or pads on the chip.

In one embodiment, the signature pattern matching and the soft reset generation logic is off scan chain and a dedicated functional pattern can be used to detect manufacturing defects for this logic. Thus, the soft reset state machine 118 is not in the scan chain path.

Figure 2:
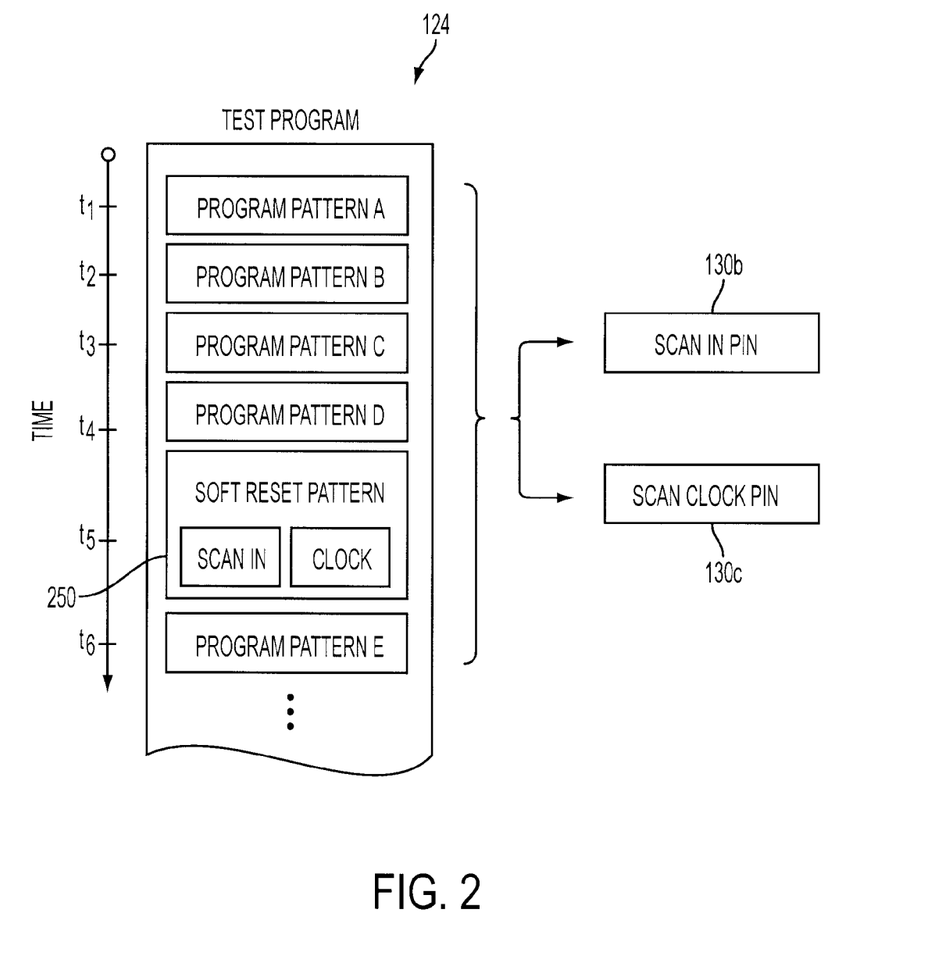
FIG. 2 illustrates example test program that includes a soft reset pattern, in accordance with one embodiment of the present invention.

FIG. 2 illustrates a diagram of a test program 124, interfacing with scan-in pins 130b and scan-clock pin 130c. As shown, a test program is constructed of a plurality of test patterns, such as test patterns A, B, C, D, and E. These patterns are defined to sequentially propagate through the tester and the chip 106 over a period of time. The scan-in pin 130b and the scan-clock pin 130c are generally used for propagating the various signals from the tester 104 to the chip 106. At time equals $t_5$, a soft reset pattern 250 is detected by the soft reset state machine 118. The soft reset pattern 250 will include a waveform that is propagated to the scan-in pin and a waveform that is propagated to the scan-clock pin. This signature pattern will then be detected by the soft reset state machine 118 to trigger a reset of the test mode registers 116 of the test controller 112, shown in FIG. 1b.

Figure 3:
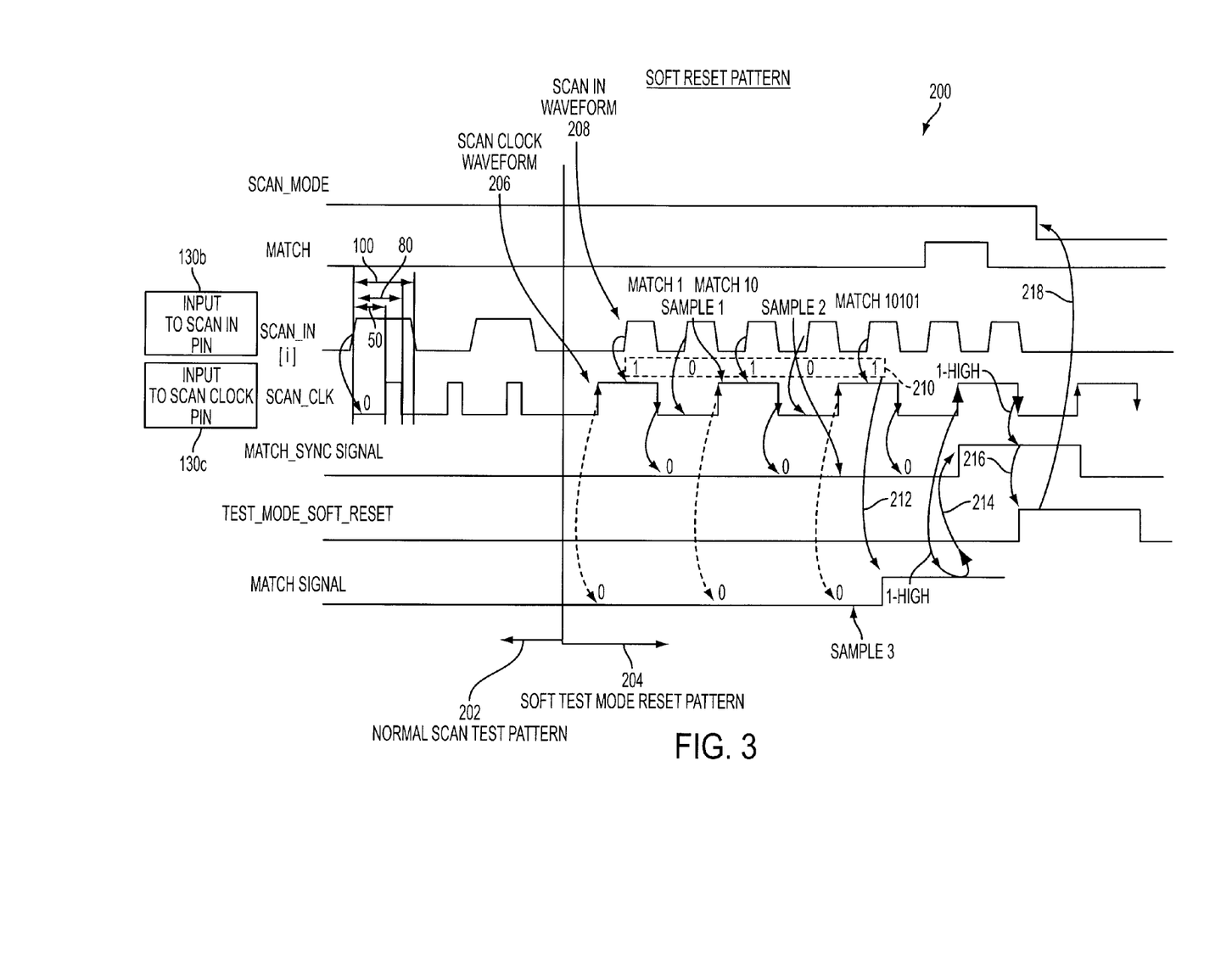
FIG. 3 illustrates sample waveforms and the transition triggers to execute a soft reset, in accordance with one embodiment of the present invention.

FIG. 3 illustrates a waveform diagram 200 that illustrates the signals propagated through the scan-in pin 130b and the input provided to the scan-clock pin 130c at the various times during execution of the test program. The waveform diagram 200 is split between times of normal scan test patterns 202 and soft test mode reset patterns 204. This example dividing line shows a change between the normal scan test pattern that will occur at a particular time when the scan-in and scan-clock pins receive the particular soft reset patterns, that will cause the soft test mode reset pattern to be triggered during time 204.

The illustrated signals include a scan mode signal (scan_mode), a match signal (match), the scan-in signal (scan-in [i]), the scan-clock signal (scan_clk), a match sync signal (match_Sync Signal), a test mode soft reset signal (test_mode_soft_reset), and a match signal (Match Signal). The scan mode signal is shown at a high state indicating that the scan mode is active during the normal scan test pattern time 202, and will remain active until deactivated during time 204. The match signal shown low indicates that a match has not yet been detected for resetting the scan mode during time 204. The normal scan-in signals, as noted above will have a rise time that is 50% of the clock period, a fall that is about 80% of the clock period, as pictorially depicted in FIG. 3. The rising edge of the scan-in signal is used to sample the scan-clock (e.g., shown as Sample 1). The match sync signal will be sampled by the falling edge of the scan-clock (e.g., shown as Sample 2), the test mode soft reset signal will be used to trigger the end of the scan mode, which is illustrated as scan mode falling from high to low. The match signal will be sampled by the rising edge of the scan-clock (e.g., shown as Sample 3).

As noted, the rising edge of the scan-in signal is used to sample the scan-clock. When the scan-in waveform 208 and the clock waveform 206 are provided through the scan-in pins 130b and the scan-clock pin 130c, the soft test mode reset actions will begin. The scan-clock will be sampled by the rising edge of the scan-in signal and depending on the scan-clock waveform 206, a different value will be sampled at the rising edge of the scan-in waveform 208. In this example, the state machine logic is configured to identify a bit match when signature pattern of 10101 is sequentially sampled from the scan-clock. As depicted, other match combinations are also possible, such as 1, 10, etc., and the state machine will likewise trigger the detection of the correct match.

Thus, the sampling of the scan-clock using the scan-in signal will first provide a logic 1, the next sampling of the rising edge will produce a logic 0, the next sampling of the rising edge will produce a logic 1, the next sampling of the rising edge will produce a logic 0, and the next sampling will provide 1. At this point, a bit match has been detected by the state machine 118, and is pictorially shown by reference number 210. The detection will trigger match signal high, as shown by 212. During this time, the rising edge of the scan-clock had been sampling the match signal and a "0" had been detected up until the bit match 210 caused the match signal to go high.

At that point, the sampling using the rising edge of the scan-clock of the match signal will detect a high instead of a low. The detected high of the match signal from the rising edge of the scan-clock sampling will trigger the match sync signal to go high by transition 214. The falling edge of the scan-clock is used to sample the match sync signal, which will detect a high but then triggers a high to the test mode soft reset signal by transition 216. Test mode soft reset being high will thus trigger transition 218 that sends scan mode signal low. Scan mode signal low will therefore be placed in soft reset.

Figure 4:
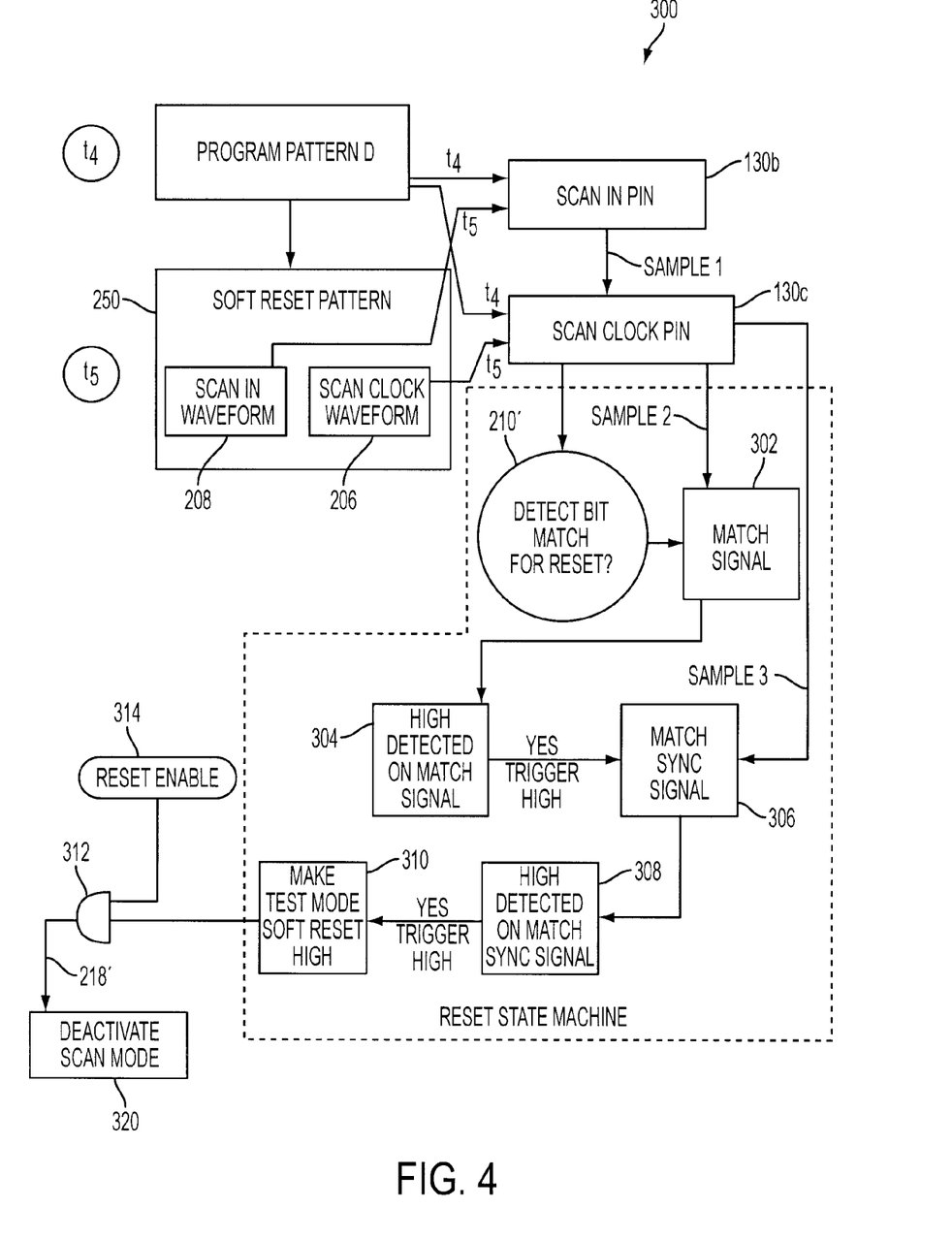
FIG. 4 illustrates example operations that a state machine processes to detect a bit match and then trigger a soft reset, in accordance with one embodiment of the present invention.

FIG. 4 illustrates state machine logic 300 that operates in response to receiving the soft reset pattern 250 at time t=5, for the example of FIG. 2. At time t=4, the normal test signals are provided by the scan-in and scan-clock, among other signals provided between the tester 104 and the chip 106. At time t=5 however, the scan-in waveform 208 and the scan-clock waveform 206 are provided through the scan-in pins 130b and scan-clock pins 130c until a bit match is detected for reset in operation 210'.

As illustrated, the scan-in waveform will be used to sample the scan-clock waveform, which will is shown as "Sample 1". For instance, in FIG. 3 the rising edge of the scan-in signal is used to sample the scan-clock until a bit match is detected when a certain bit pattern has been observed from the scan-clock waveform 206. The positive edge of the scan-clock will also be sampled and shall be referred to as "Sample 2". The negative edge of the scan-clock is also sampled and shall be referred to as "Sample 3". The state machine 118 will thus control the Sample 1, Sample 2, and Sample 3 to continue in search of a bit match.

When a bit match has been detected, the bit match 210 will trigger the high at transition 212 for the match signal shown in FIG. 3. Match signal being sampled by the positive edge of the scan-clock is shown as match signal 302 in FIG. 4. Match signal sampled by the positive edge will be detected as being high in operation 304. In operation 304, a high on the match signal will trigger a high on the match sync signal in operation 306. The match sync signal is sampled by the negative edge of the scan-clock—Sample 3. When the match sync signal is detected high by operation 308, the test mode soft reset will trigger a reset high in operation 310.

The test mode soft reset signal going high in FIG. 3 is thus triggered by Sample 3, where the negative edge of the scan-clock will trigger a read of the scan mode soft reset signal which will be high. The output from the reset state machine logic will thus be provided to an AND gate 312, that also receives a reset enabled 314. If reset enabled 314 is also high then signal 218' will deactivate the scan mode in operation 320. The scan mode being deactivated means that the test controller registers are cleared by the state machine. If the chip is running at-speed test mode, this mode can also be reset. The AND gate 312 is optional and is used to ensure that the reset only occurs when the rest enable is also provided. This provides extra security to ensure that unwanted resets do not occur.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A soft-function trigger state machine, comprising:
state machine circuitry defined to use a scan-in waveform to sample a scan-clock waveform to obtain a sampled data pattern, the state machine circuitry defined to compare the sampled data pattern to a soft action pattern to determine whether the sampled data pattern matches the soft action pattern, and the state machine circuitry defined to trigger an action associated with the soft action pattern when the sampled data pattern matches the soft action pattern.

2. A soft-function trigger state machine as recited in claim 1, wherein the soft-function trigger state machine is defined within an integrated circuit chip that does not include a reset pin.

3. A soft-function trigger state machine as recited in claim 1, wherein the scan-in waveform is received through a scan-in pin to which the state machine circuitry is connected, and wherein the scan-clock waveform is received through a scan-clock pin to which the state machine circuitry is connected.

4. A soft-function trigger state machine as recited in claim 1, wherein the state machine circuitry is defined to sample the scan-clock waveform in accordance with rising edges of the scan-in waveform.

5. A soft-function trigger state machine as recited in claim 1, wherein the soft-function trigger state machine is defined outside of a scan chain path.

6. A soft-function trigger state machine as recited in claim 1, wherein the action associated with the soft action pattern is an exiting of a scan mode.

7. A soft-function trigger state machine as recited in claim 1, wherein the action associated with the soft action pattern is a resetting of a scan mode.

8. A soft-function trigger state machine as recited in claim 1, wherein the action associated with the soft action pattern is a stopping of a clock.

9. A soft-function trigger state machine as recited in claim 1, wherein the action associated with the soft action pattern is a changing of an oscillation trim value.

10. A soft-function trigger state machine as recited in claim 1, wherein the action associated with the soft action pattern is a changing of a regulator trim value.

11. A method for operating a reset state machine, comprising:
    simultaneously receiving a scan-in waveform and a scan-clock waveform;
    sampling the scan-clock waveform in accordance with a rising edge of the scan-in waveform;
    detecting a bit match when a certain bit pattern is observed from the sampled scan-clock waveform; and
    asserting a test mode soft reset signal in response to detecting the bit match.

12. A method for operating a reset state machine as recited in claim 11, wherein the reset state machine is defined within an integrated circuit chip that does not include a reset pin.

13. A method for operating a reset state machine as recited in claim 11, wherein the scan-in waveform is received through a scan-in pin to which the reset state machine is connected, and wherein the scan-clock waveform is received through a scan-clock pin to which the reset state machine is connected.

14. A method for operating a reset state machine as recited in claim 11, wherein the reset state machine is defined outside of a scan chain path.

15. A method for operating a reset state machine as recited in claim 11, further comprising:
    sampling a positive edge of the scan-clock waveform as a match signal;
    sampling a negative edge of the scan-clock waveform as a match sync signal, and
    wherein detecting the bit match causes the match signal to transition to a high state, and
    wherein transition of the match signal to the high state causes the match sync signal to transition to a high state in accordance with a next edge of the scan-clock signal, and
    wherein transition of the match sync signal to the high state causes assertion of the test mode soft reset signal in accordance with a next edge of the scan-clock signal.

16. A method for operating a reset state machine as recited in claim 11, further comprising:
    providing the test mode soft reset signal to an AND gate;
    providing a reset enable signal to the AND gate,
    wherein an output of the AND gate controls a test mode reset operation.

17. A method for operating a reset state machine as recited in claim 11, wherein the scan-in waveform has a rise time that is about 50% of a period of the scan-clock waveform.

18. A method for operating a reset state machine as recited in claim 17, wherein the scan-in waveform has a fall time that is about 80% of the period of the scan-clock waveform.

19. A method for operating a reset state machine as recited in claim 11, further comprising:
    transmitting the test mode soft reset signal to a test controller.

20. A method for operating a reset state machine as recited in claim 19, wherein the test controller is Joint Test Access Group (JTAG) test access port (TAP) controller.

* * * * *